(12) United States Patent
Talwalkar et al.

(10) Patent No.: US 7,142,606 B2
(45) Date of Patent: Nov. 28, 2006

(54) METHOD AND APPARATUS FOR SHARED PROCESSING A PLURALITY OF SIGNALS

(75) Inventors: Sumit Anil Talwalkar, Plantation, FL (US); Charles Leroy Sobchak, Davie, FL (US); Mahibur Rahman, Lake Worth, FL (US)

(73) Assignee: FreeScale Semiconductor, Inc., Austin, TX (US)

( * ) Notice: Subject to any disclaimer, the term of this patent is extended or adjusted under 35 U.S.C. 154(b) by 793 days.

(21) Appl. No.: 10/256,906

(22) Filed: Sep. 27, 2002

(65) Prior Publication Data

US 2004/0066803 A1    Apr. 8, 2004

(51) Int. Cl.
H04L 27/00 (2006.01)
H03M 1/00 (2006.01)
G06F 17/10 (2006.01)
H03F 1/02 (2006.01)

(52) U.S. Cl. ............. 375/259; 341/143; 208/317; 330/9

(58) Field of Classification Search ........... 375/259; 768/317; 341/143–155
See application file for complete search history.

(56) References Cited

U.S. PATENT DOCUMENTS

| | | | |
|---|---|---|---|
| 5,345,233 A | | 9/1994 | Nagata et al. |
| 5,561,660 A | * | 10/1996 | Kotowski et al. ........... 370/215 |
| 5,627,536 A | * | 5/1997 | Ramirez ..................... 341/141 |
| 5,786,778 A | * | 7/1998 | Adams et al. ................ 341/61 |
| 6,108,680 A | * | 8/2000 | Liu et al. ..................... 708/317 |
| 6,154,161 A | * | 11/2000 | Leme et al. ................. 341/143 |
| 6,369,735 B1 | * | 4/2002 | Yang ........................... 341/144 |
| 6,518,903 B1 | * | 2/2003 | Perraud et al. ............. 341/143 |
| 6,646,581 B1 | * | 11/2003 | Huang ........................ 341/143 |
| 2003/0037083 A1 | * | 2/2003 | Todsen et al. .............. 708/313 |
| 2003/0058149 A1 | * | 3/2003 | Jayadeva .................... 341/158 |
| 2003/0231125 A1 | * | 12/2003 | Freeman et al. ............ 341/143 |

FOREIGN PATENT DOCUMENTS

EP    0 742 645 A2    11/1996

OTHER PUBLICATIONS

Xueshen Wang, We Qin, and Xieting Ling, "Cascaded Parallel Oversampling Sigma-Delta Modulators", IEEE Transactions on Circuits and Systems-II: Analog and Digital Signal Processing, vol. 47, No. 2, Feb. 2000, pp. 156-161.

(Continued)

*Primary Examiner*—Khai Tran
*Assistant Examiner*—Cicely Ware
(74) *Attorney, Agent, or Firm*—Charles W. Bethards

(57) ABSTRACT

A signal processing apparatus preferably suitable for implementation as an integrated circuit, that is arranged and constructed to be shared for processing a plurality of signals without interference between the signals and method thereof, the signal processing apparatus comprising: an input multiplexer for sequentially selecting from among the plurality of signals to provide a sequence of selected signals; a processing unit for processing the sequence of selected signals to provide a sequence of processed signals, the processing unit having an input coupled to the input multiplexer and a delay stage including a plurality of series coupled delay elements with one delay element corresponding to each of the plurality of signals; and an output de-multiplexer for sequentially selecting from the sequence of processed signals to provide a plurality of processed signals corresponding one to one with the plurality of signals.

27 Claims, 8 Drawing Sheets

OTHER PUBLICATIONS

Pervez M. Aziz, Henrik V. Sorensen, and Jan Van Der Spiegel, "An Overview of Sigma-Delta Converters", IEEE Signal Processing Magazine, Jan. 1996, pp. 61-84.

R. W. Stewart and E. Pfann, "Oversampling and Sigma-Delta Strategies for Data Conversion", Electronics & Communication Engineering Journal, Feb. 1998, pp. 37-47.

Ramin Khoini-Poorfard, Lysander B. Lim, and David A. Johns, "Time-Interleaved Oversampling A/D Converters: Theory and Practice", IEEE Transactions on Circuits and Systems-II: Analog and Digital Signal Processing, vol. 44, No. 8, Aug. 1997, pp. 634-645.

* cited by examiner

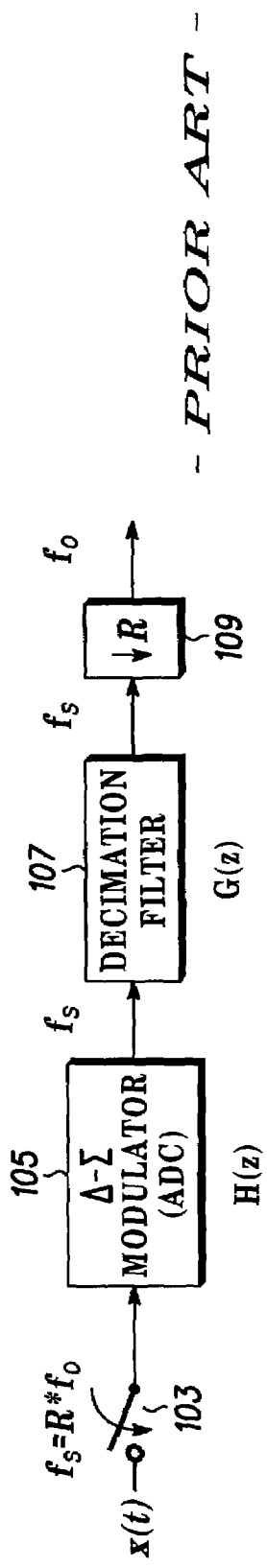
FIG. 1 — PRIOR ART —
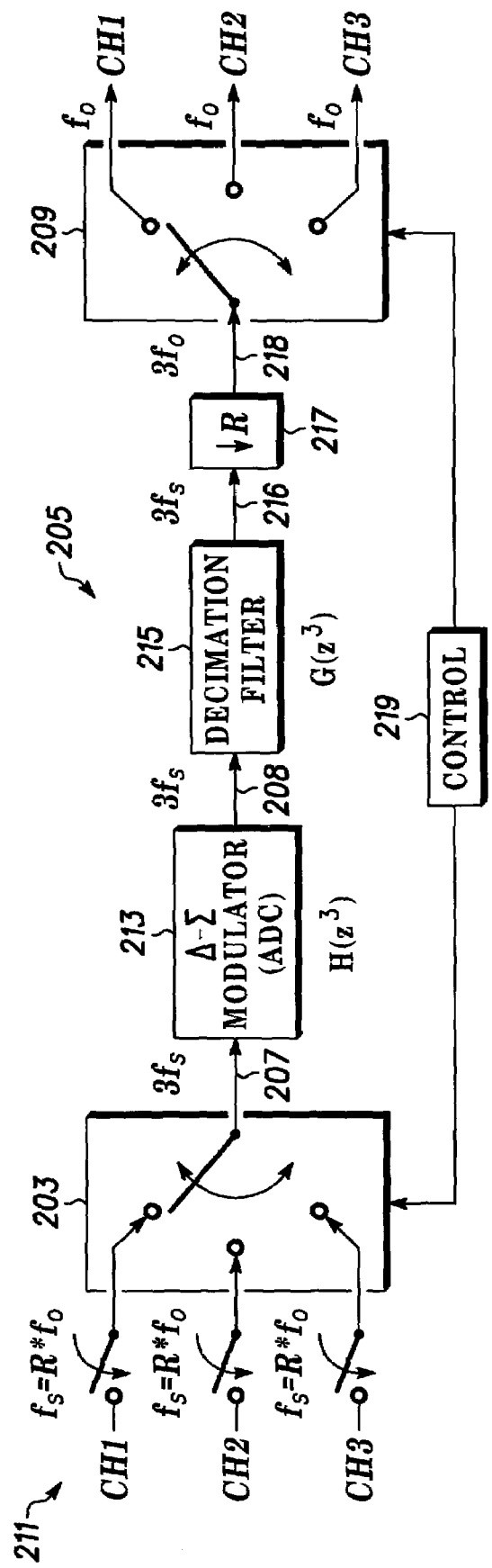
FIG. 2

METHOD AND APPARATUS FOR SHARED PROCESSING A PLURALITY OF SIGNALS

FIELD OF THE INVENTION

This invention relates in general to signal processing and more specifically to methods and apparatus for shared processing of a plurality of signals without interference between the signals.

BACKGROUND OF THE INVENTION

Signal processing in general is a known field. Virtually every piece of electronics includes some form and degree of signal processing. However the complexity of systems, such as communications systems and protocols within those systems, is also growing and the amount of signal processing seems to increase exponentially. Often apparatus, such as a digital signal processor based apparatus that is specially adapted for the task, perform the processing on signals in a digital form. However most signals from or required by the "real world" come in an analog form rather than digital form. Thus these DSP based apparatus still require conversion between the analog and digital domains as well as various other conditioning processes. Much of the conversion and conditioning processing amounts to doing the same or nearly same processing in parallel on a plurality of signals or information streams. Often it would be economically advantageous, for example in terms of smaller integrated circuit die sizes, if one processing function or apparatus could be used for a plurality of signals, however this has been problematic because of interference between signals induced by the shared processing.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 1 depicts, in an exemplary form, a block diagram of a prior art processing system for converting an analog signal to a digital signal;

FIG. 2 depicts a block diagram of a preferred embodiment of a signal processing apparatus for shared processing of a plurality of signals according to the present invention;

DETAILED DESCRIPTION OF PREFERRED EMBODIMENT

Figure 3:
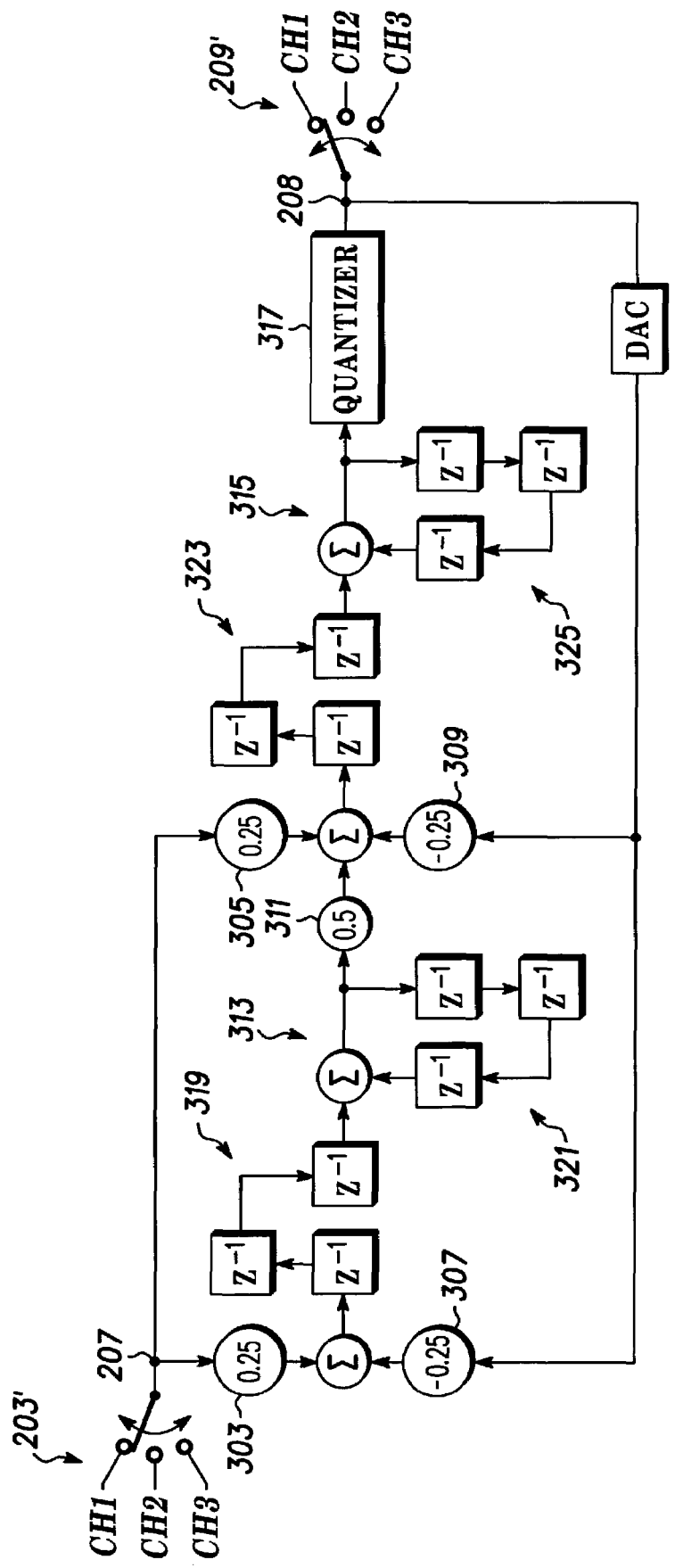
FIG. 3 depicts an exemplary block diagram of a delta sigma converter suitable for use in the FIG. 2 apparatus according to the present invention.

In overview form, the present disclosure concerns methods and apparatus for shared processing of a plurality of signals without inducing any interference between the signals. More particularly, various inventive concepts and principles embodied in methods and apparatus, such as integrated circuits for effecting such shared processing are disclosed and discussed. The signal processing systems, apparatus, and methods of particular interest are those that utilize discrete time processing of signals or sampled signals or conversion between analog and digital domains for such signals.

As will become evident from the discussions below, the various inventive principles, concepts, and combinations thereof are broadly applicable for implementing shared processing of multiple signals, such as sampled analog or digital signals, without inducing interference or cross talk between the respective signals so long as any processing function having memory (current result depends on previous results) is linear, thus alleviating various problems associated with known systems provided these principles and concepts or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in integrated circuits (ICs) such as application specific ICs or software programs or instructions. It is expected that one of ordinary skill, notwithstanding possibly significant effort and many design choices motivated by, for example, available time, current technology, and economic considerations, when guided by the concepts and principles disclosed herein will be readily capable of generating such ICs or software instructions and programs with minimal experimentation. Therefore, in the interest of brevity and minimization of any risk of obscuring the principles and concepts according to the present invention, further discussion of such ICs and software, if any, will be limited to the essentials with respect to the principles and concepts within the preferred embodiments.

Referring to FIG. 1, an exemplary block diagram of a conventional processing system for converting a single analog signal to a digital signal will be discussed and described in order to set the stage for descriptions of the inventive embodiments and advantages of the later figures.

FIG. 1 shows a typical analog to digital converter (ADC), such as a second order 1 bit delta sigma converter, for an analog signal x(t). Initially a sampler 103 operating at a sampling frequency $f_s$ that is R times $f_o$, the Nyquist frequency in theory and 1.5 to 2 times the Nyquist frequency in practice where the Nyquist frequency is twice the highest frequency component of x(t), samples x(t) to provide samples at a rate of $f_s$. R is an over sampling ratio that in the end will factor into the precision of the analog to digital conversion. Typically $f_s$ is an order of magnitude greater than $f_o$ and it is common to select R as a power of 2, such as 16 or 32.

These samples are coupled to a conventional delta sigma modulator (ADC) 105 with a transfer function of H(z). For instance the ADC may be a second order, one-bit delta sigma converter or ADC that generates a digital bit stream at rate $f_s$ that corresponds to the sampled data stream based on x(t). The digital bit stream is coupled to a decimation filter 107, with a transfer function of G(z), that operates to remove frequency components that may result in aliasing noise as well as other noise generated by the sigma delta converter in the output signal once it is coupled to and processed by the down sampler 109. The down sampler 109 essentially selects and outputs every $f_o/f_s$ word provided by the decimation filter thus providing a word stream at rate $f_s$ where the width of each word will depend on the order of the decimation filter among other variables. For example, a first order comb filter with an R of 16, would provide 4 bit words, while higher order filters will provide wider words. In sum, a one-bit delta sigma converter has been utilized to provide 4 or more bit resolution.

One way to do the signal processing that may be required by a plurality of signals, such as x(t), is to duplicate the functional blocks just described for each signal. However this can result in substantial duplication of processing resources and large integrated circuit die sizes with the resultant economic burdens. Merely sequentially multiplexing multiple signals through these processing blocks that have memory unfortunately results in interference between the multiple signals. Clearly a need exists to improve this situation.

Referring to FIG. 2 a block diagram of a preferred embodiment of a signal processing apparatus 200 for shared processing of a plurality of signals will be discussed and described. The signal processing apparatus is particularly suited for implementation in integrated circuit form as one or more integrated circuits. This signal processing apparatus 200 is arranged and constructed to be shared, in large part, for processing a plurality of signals without causing, inducing, or resulting in interference between the signals. The signal processing apparatus includes an input multiplexer 203 for sequentially selecting from among the plurality of signals, generally N signals but with three, namely CH1, CH2, and CH3 shown here, to provide a sequence of selected signals at N, the number of multiplexed signals, times the sampling frequency, shown here at $3f_s$ given our example with three signals. Further included is a processing unit 205 for processing the sequence of selected signals to provide a sequence of processed signals, the processing unit having an input 207 coupled to the input multiplexer and a delay stage including a plurality of series coupled delay elements with one delay element corresponding to each of the plurality of signals. This delay is shown or noted generally by the transfer functions $H(z^3)$, $G(z^3)$ and will be further discussed below with reference to additional figures. The apparatus additionally includes an output de-multiplexer 209 for sequentially selecting from the sequence of processed signals to provide a plurality of processed signals, here digital representations, corresponding one to one with the plurality of signals.

In its most general form, the processing unit 205, for use in a shared processing apparatus or as a shared processing unit, can be formed from a conventional processing unit with transfer function T(z) by replacing each delay element with a delay stage including N series-coupled delay elements, where N is the number of signals that will share the processing apparatus to provide a new transfer function $T(z^N)$. The processing unit can be any sampled (analog or digital) data processing unit provided that any non-linear elements do not have memory or an associated delay element. For example, filters such as infinite impulse response (IIR) filters or finite impulse response (FIR) filters implemented according to the principles and concepts herein disclosed and discussed are particularly suited to be used for shared processing among a plurality of signals.

The plurality of signals is provided to the input multiplexer 203 by N, here three, signal samplers 211 with one signal sampler coupled to each of the continuous time analog signals at each of the channels, CH 1, CH 2, and CH 3. The signals on the respective channels can be almost any continuous time signal although the Channel or signal with the highest Nyquist frequency or processing rate corresponding thereto will ultimately control the appropriate sampling frequency. For example, if the shared processing apparatus is implemented within a cellular handset, the input multiplexer can be used to sequentially select the plurality of signals from or to correspond to: 1) two or more unique multiple access signals, such as time division multiple access (TDMA) signals and code division multiple access (CDMA) signals; 2) a complex signal having in phase and quadrature components on different channels; 3) multiple spatial diversity signals such as found in transmitter or receiver diversity systems; or 4) multiple temporal diversity signals such as the base band signals provided by a rake receiver in, for example, CDMA cellular systems. The different channels may carry different audio signals such as left and right and so on in a stereo or a surround sound system.

In any event each channel or signal thereon is over sampled at a rate $f_s=Rf_o$, and the input multiplexer 203 selects a sample from each of the N channels, here 3, at the sampling rate thus providing the sequence of selected signals, specifically samples of the signals or sequence of sampled signals at the rate of $Nf_s$ or here $3f_s$ to the processing unit 205. The processing unit in this example includes a delta sigma (or sigma delta) modulator 213, with a transfer function $H(z^3)$, acting as an analog to digital converter) for converting the sequence of selected signals from a sequence of sampled signals to a sequence of corresponding digital signals that are or may be viewed as the sequence of processed signals noted more generally above. These digital signals will be digital words with a bit width corresponding to the form of sigma delta modulator used or more specifically the quantizer portion of the modulator. For example, preferably, a one-bit quantizer is used so the processed signals are a word stream with one-bit words at a rate of $3f_s$ that are interleaved bits corresponding or depending on the respective plurality of signals and channels. Note that the delta sigma modulator has the same transfer function as used in FIG. 1 with the variable changed from z to $z^3$ or more generally $z^N$ for N multiplexed signals.

As depicted, preferably the apparatus or processing unit of FIG. 2 further includes a down-sampler 217 that selects a portion of the sequence of corresponding digital signals to be the sequence of processed signals, the portion being a fraction of the sequence of corresponding digital signals and including an equal representation from each of the corresponding digital signals. Normally and as here shown, the signal processing apparatus or processing function will also include a decimation filter 215 when the function is concerned with analog to digital conversion using a sigma delta converter. The decimation filter will have an input 208 coupled to and receiving the sequence of corresponding digital signals, an output 216 coupled to the down-sampler, and a filter delay stage including a plurality of series coupled filter delay elements with at least one filter delay element corresponding to each one of the plurality of signals. Note that at different sample times a specific delay element may be holding a linear combination of a different one of the plurality of signals.

The decimation filter has a transfer function $G(z^3)$ {$G(z)$ in FIG. 1 with z replaced by $z^3$ or generally $z^N$} and is for filtering the sequence of corresponding digital signals to limit frequency components of the sequence of corresponding digital signals before the down sampler selects the portion of the sequence of corresponding digital signals. By way of example suppose R=16 and N=3, then the sigma delta converter provides a bit or word stream at 48 times $f_o$ to the decimation filter. The decimation filter will provide an output word stream at the same rate where the width of the words will depend on the type of filter and the over sampling rate. Suppose M stages of a comb filter are used for the decimation filter. In that case the output word width in bits will be $M\log_2 R$. If one stage is used, the output word width will be 4 bits since log base 2 of 16 is 4. Thus in the example, 4 bit words will be provided at a rate 48 times $f_0$ to the down sampler where these words are interleaved, meaning every third word depends on the same one of the plurality of, here three, input signals. The down sampler will select 3 of each 48 of these words and supply them, via output 218 to the output de-multiplexer 209 that operates at an $f_o$ rate to couple the respective one of these three 4 bit words to the output channel as a digital 4 bit word corresponding to the input signal. To synchronize these operations a controller 219 is used. The controller 219 insures that the phase relationships between the input multiplexer and output multiplexer are proper taking into consideration the delay through the processing unit. One of ordinary skill can determine this for the particular processing function by analysis or experimentation.

The processing function can implement any process so long as any non-linear functions do not have memory or delay elements as part of there transfer functions. For example the processing function could be a linear filter or a filter using or including a sigma delta based filter for converting the sequence of selected signals from a sequence of sampled signals to a sequence of corresponding digital signals that have been filtered. This filter can have a general frequency response such as a low pass, high pass, or band pass response as is known, provided the delay elements of the filter are modified as herein described to include series coupled elements with at least one element corresponding to each multiplexed signal. The delay elements can be implemented, for example, as flip-flops such as D flip-flops or as a shift register including a plurality of delay elements for digital portions of the processing unit or as switched capacitor elements for continuous valued discrete time signals such as sampled analog signals. The processing function can be a digital to analog converter using a delta sigma converter, as we will be further discussed below with reference to FIG. 8.

Referring to FIG. 3 an exemplary block diagram of a delta sigma converter 300 suitable for use in the FIG. 2 apparatus as the delta sigma modulator 213, will be briefly discussed and described. The delta sigma converter or modulator 300 is shown with a sequence of sampled signals being provided by the input multiplexer 203' at the input 207. The delta sigma converter or modulator 300 converts these samples or sampled signals to a sequence of corresponding digital signals at output 208 and these are de-multiplexed by the de-multiplexer 209' as shown. The delta sigma converter or modulator 300 is a conventional delta sigma or sigma delta converter with a key important and inventive distinction. In other words whatever design considerations, based, for example, on characteristics of the signals to be processed, desired results, and so on that caused the particular gain coefficients 303–311 to be selected, the order of the modulator, here two as there are two integrators 313, 315 chosen, and the quantizer 317, here a one-bit quantizer, selected, are still valid provided the signals to be multiplexed have similar or compatible characteristics and the desired results for each are compatible.

What has changed is that each delay stage or element in the original or non-shared sigma delta modulator is replaced with N stages or elements, where N corresponds to the number of signals being multiplexed to share the sigma delta modulator. For example in FIG. 3 the delay stages 319, 321, 323, and 325 which are now 3 series coupled delay elements for the shared sigma delta modulator converter would be one delay element in the original converter of FIG. 1, specifically $G(z)$ has been replaced with $G(z^3)$ or in the general situation with $G(z^N)$. One way to appreciate what is occurring is to note that at each instance where a previous result for, for example channel 1 samples, would effect the present result for channel 1 samples, that previous result will have been clocked through the series coupled delay stage and thus be available to be used for determining the present result. Note that the input signals in the specific instance are continuous valued discrete time signals and that the various functions, summers, delays, etc, of the delta sigma converter or modulator are preferably implemented with conventional switched capacitor technology and switched capacitor delay elements.

Figure 4:
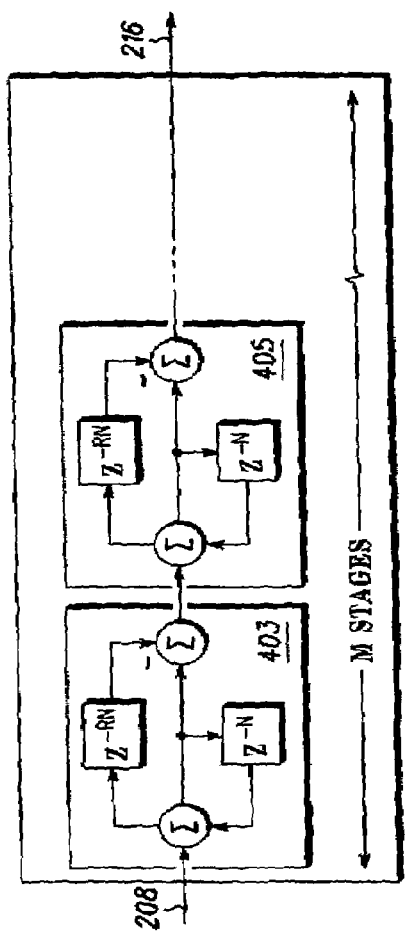
FIG. 4 depicts a block diagram of a filter suitable for use in the FIG. 2 apparatus according to the present invention.

Referring to FIG. 4, a block diagram of a filter suitable for use in the FIG. 2 apparatus as the decimation filter 215 will be discussed and described. FIG. 4 shows an $M^{th}$ order comb filter that has been modified for shared processing of a plurality of signals according to the principles and concepts discussed and disclosed herein. Generally comb filters are known and a single stage will have a characteristic or transfer function of $1-z^{-R}/1-z^{-1}$ in the z domain. $M^{th}$ order comb filters are formed by series coupling multiple stages. The particular characteristics or results that are required of a processing function, such as number of bits or resolution will determine the number of stages required. In any event just as discussed above whatever drove the practitioner to choose $G(z)$ for the decimation filter response in FIG. 1 still applies here with shared processing, given compatible input channel signals and output results. Thus FIG. 4 shows the input 208 coupled to an $M^{th}$ order comb filter, with two stages 403, 405 depicted, that is suitable for shared processing with the filtered result available at the output 216. The overall transfer function of the depicted filter is $G(z^N)$, rather than $G(z)$ as in FIG. 1, where in our FIG. 2 example, N=3. Thus the response or transfer function of each stage is $1-z^{-RN}/1-z^{-N}$ as will be evident to one of ordinary skill whether by inspection or analysis of the depicted architecture. A shift register of length RN or N or a like number of series coupled flip flops can be used for the $z^{-RN}$ or $z^{-N}$ functions or delay stages, respectively.

Figure 5:
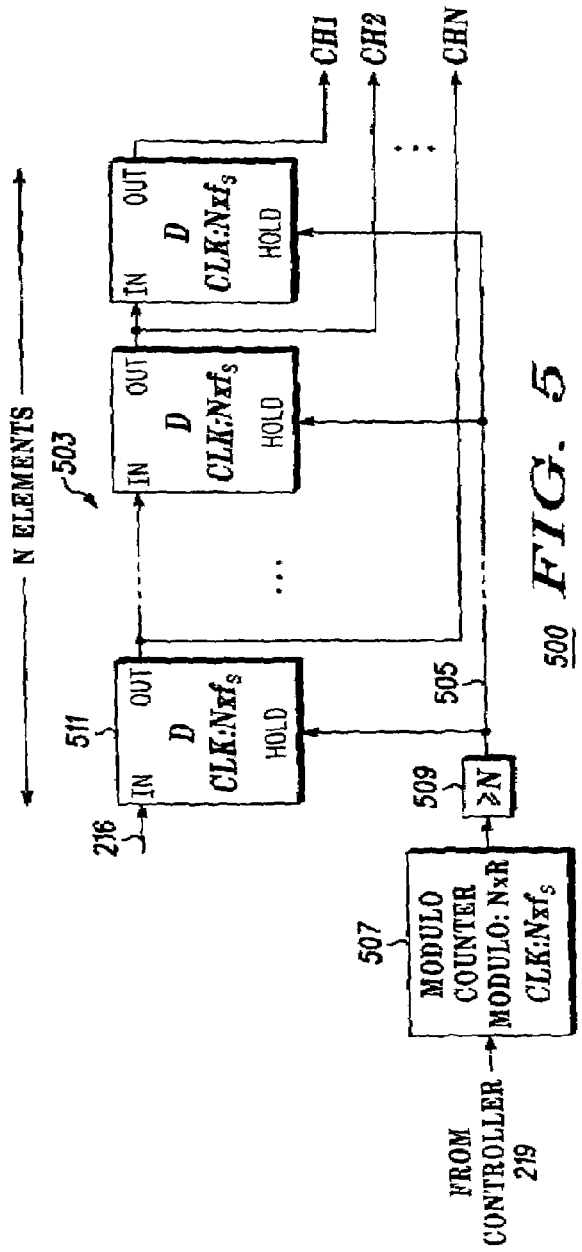
FIG. 5 depicts a block diagram of a down sampler and de-multiplexer combination suitable for use in the FIG. 2 apparatus according to the present invention.

Referring to FIG. 5, a block diagram of a down sampler and combination de-multiplexer suitable for use in the FIG. 2 apparatus will be discussed and described.

Figure 6:
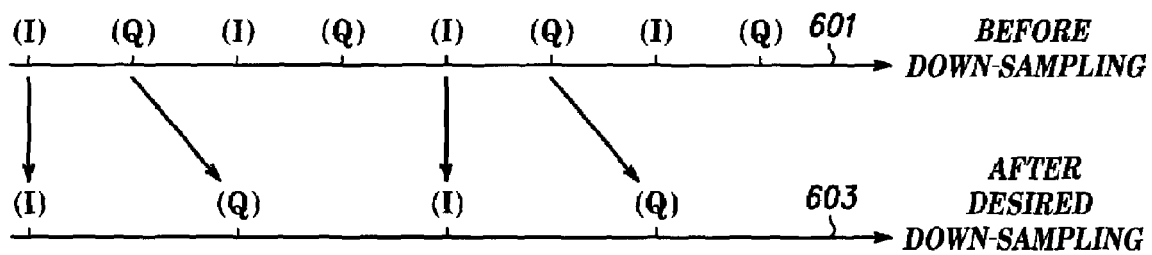
FIG. 6 and FIG. 7 depict in simplified diagrams the desired results of the FIG. 5 down sampler.
Figure 7:
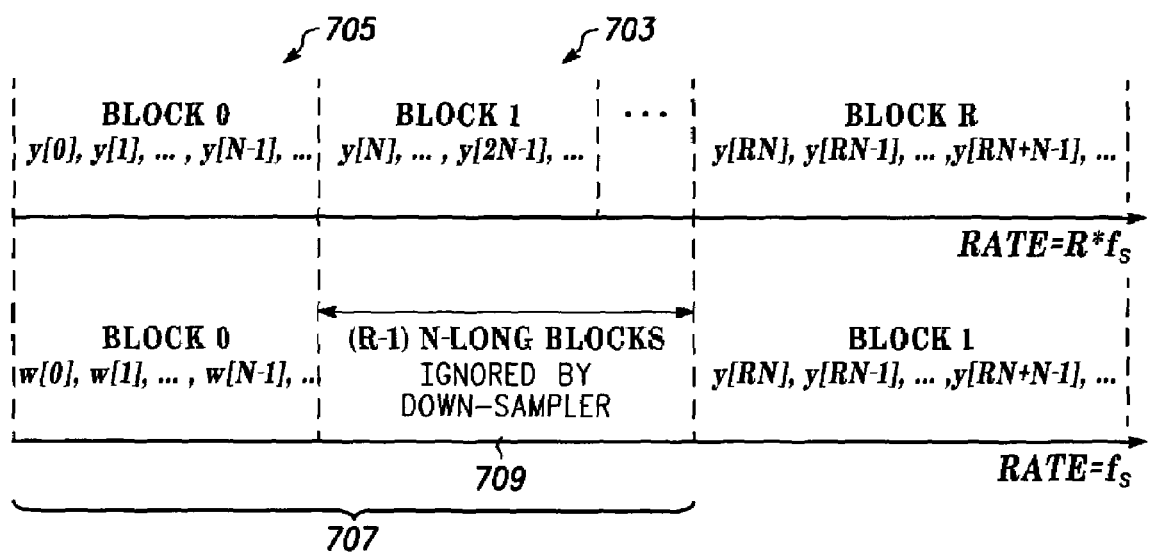

This discussion will also refer to the FIG. 6 and FIG. 7 simplified diagrams showing the desired function or results of the FIG. 5 down sampler. Essentially in down sampling the objective is to retain 1 sample and discard R-1 samples. However in a shared processing system such as that depicted in FIG. 2 care must be taken to select the proper portion of the sequence of corresponding digital signals as the sequence of processed signals where the portion is a fraction, namely 1/R of the sequence of corresponding digital signals such that the output includes an equal representation from each of the corresponding digital signals that were input to the shared processing system. In some circumstances where there is some correlation between the channels it may be important to select the "same" sample or sample from the same time instant from or corresponding to each channel. In other words we need to retain the proper N samples or processed signals and discard the remaining N(R-1) samples or digital words.

For example in FIG. 6 an example where we wish to drop every other signal or sample of the samples shown on the top line 601 is depicted. If every other sample is dropped then only I samples remain and the Q samples are not represented. However if we select properly, namely a block of samples or adjacent I and Q samples and drop the intervening blocks of I and Q samples the end result is one half the number of samples with equivalent representation for each channel as shown on the lower line 603. Referring to FIG. 7 this is generalized to blocks 703 each with N samples, one each for each of N channels and where one complete block 705 out of each R blocks 707 is retained with the balance of R-1 blocks 709 dropped or ignored.

This is accomplished with the down sampler of FIG. 5. In FIG. 5 the digital words from the decimation filter are input at 216 to N or in the FIG. 2 example 3, series coupled D registers 503, each as wide as the word and each clocked at $Nf_s$ or $3f_s$. The words input at 216 are shifted from one register to the next until the hold signal at bus 505 is applied. The hold signal is generated whenever the count from a modulo counter 507, with modulo NR, clocked at $Nf_s$ equals or exceeds N as determined by comparator 509. The modulo counter is set to "0" or reset by a signal from the controller 219 and as is known counts 0,1,2 . . . NR-1, 0,1,2, . . . . Thus N words, one each for each channel or 3 words in the FIG. 2 example, are shifted into the N D registers and then the count from the modulo counter is equal to N and the hold signal is asserted. Thereafter the next NR-N samples or R-1 blocks are ignored as the hold signal continues to be asserted. The words in the respective shift registers correspond to the appropriate channel as indicated. Note that a register can be added, clocked and enabled at $f_o$, to gate or provide these words to the respective channels if desired. Also note that the output from D register 511 labeled CH N is the sequence of words corresponding respectively to CH 1 through CH N and this can be provided or gated to a de-multiplexer by an inverted version of the hold signal.

Figure 8:
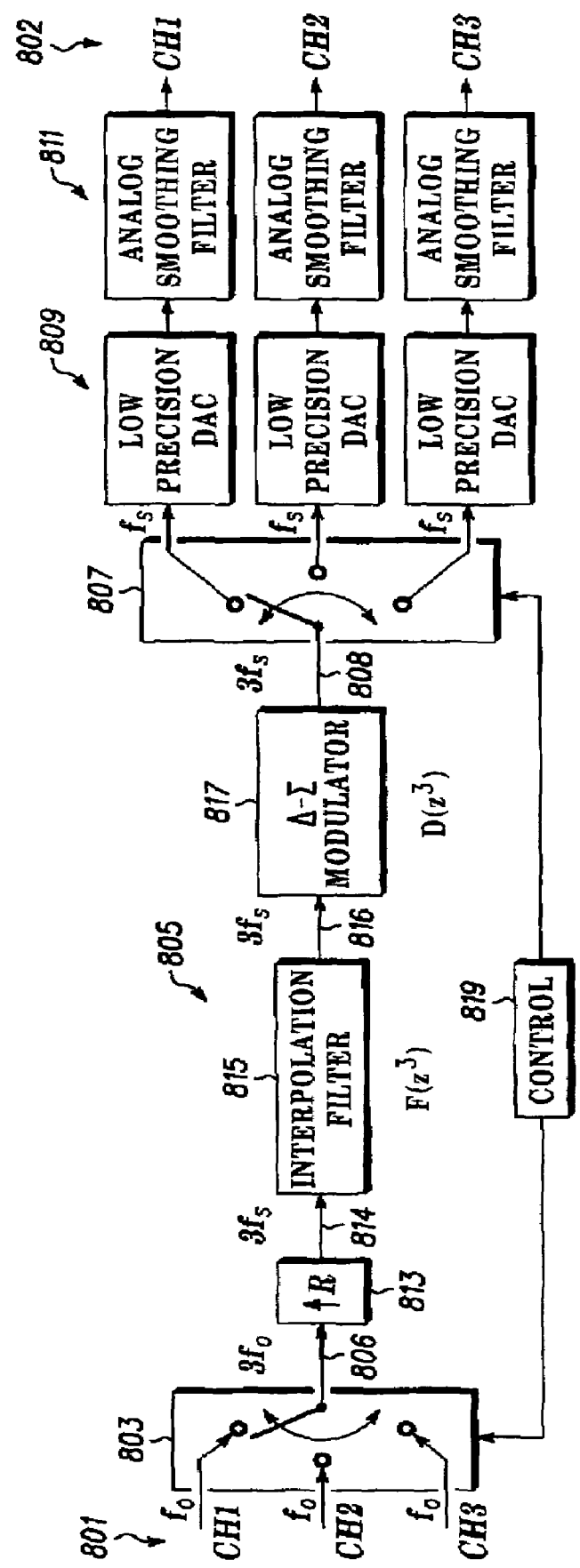
FIG. 8 depicts a block diagram of another preferred embodiment of a signal processing apparatus for shared processing of a plurality of signals according to the present invention.

Referring to FIG. 8 another example of a signal processing apparatus that is arranged and constructed to perform shared processing for a plurality of signals without interference between the signals and that is suited for implementation as an integrated circuit will be discussed and described. In this example digital words 801 indicative of CH 1 through CH 3 or in general CH N are converted to corresponding analog signals 802. The apparatus or integrated circuit includes an input multiplexer 803 for sequentially selecting at an $f_o$ rate from among the plurality of signals or digital words 801 to provide a sequence of selected signals to a processing unit 805 at a $3f_0$ or generally $Nf_0$ rate. The processing unit is for processing the sequence of selected signals to provide a sequence of processed signals and has an input 806 coupled to the input multiplexer and a delay stage including a plurality of series coupled delay elements with one delay element corresponding to each of the plurality of signals (generally represented by the $F(z^3)$ and $D(z^3)$ transfer functions. Further included is an output de-multiplexer 807 for sequentially selecting from the sequence of processed signals at 808 to provide a plurality of processed signals corresponding one to one with the plurality of signals. These processed signals are, respectively, coupled to low precision DACs 809 (outputs of either 1 or 0) and these are coupled to conventional analog filters 811 with a response or cutoff frequency of $f_o/2$ or slightly less.

Figure 10:
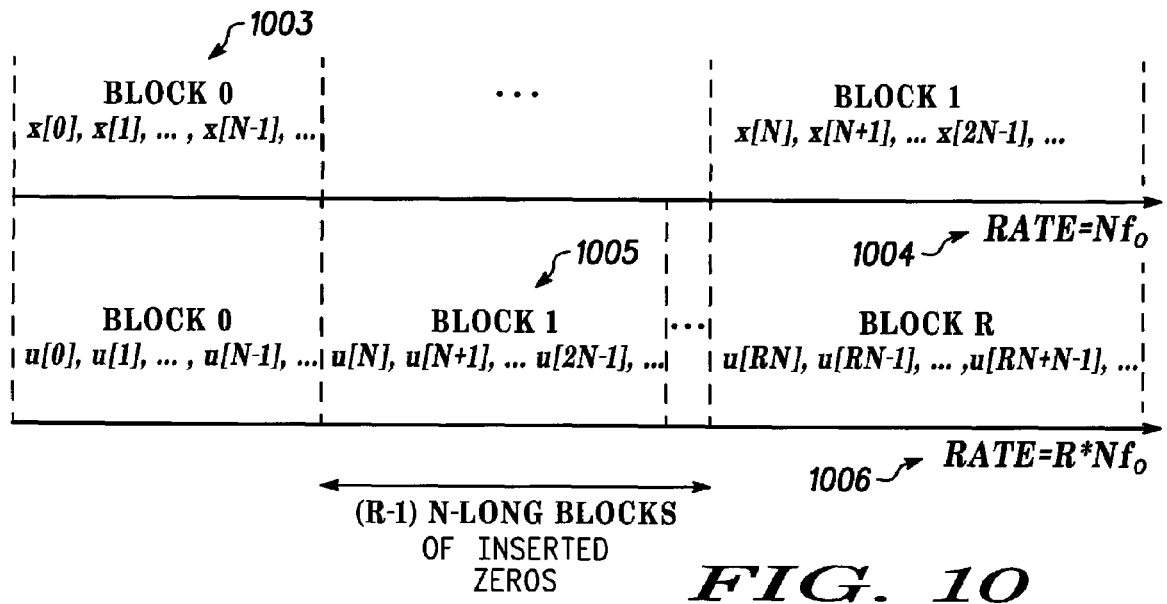
FIG. 10 depicts a simplified diagram of the FIG. 9 up sampler data results.

The apparatus or integrated circuit of FIG. 8, specifically processing unit 805, further includes an up sampler 813, an interpolation filter 815, and a sigma delta digital to analog converter (DAC) 817 for converting or facilitating the conversion of the sequence of selected signals into the plurality of processed signals that correspond to a sampled analog version of the plurality of signals. The up sampler 813 operates to insert R-1, length N or here 3 words, containing all zeros and provides the results at 814 to the interpolation filter 815. This is depicted in FIG. 10 where one block of N words 1003 at rate $Nf_o$ 1004 is followed by R-1 N-long blocks 1005 of inserted zeros to provide a resultant signal at rate $RNf_o$ 1006. Interpolation filters with transfer functions F(z) are known. Whatever objectives motivate a practitioner to use a particular transfer function still apply, however the interpolation filter must be replaced with a shared processing interpolation filter having a transfer function $F(z^N)$ or here $F(z^3)$ where the exponent corresponds to the number of signals sharing the processing unit for the reasons and in the same fashion as noted above with reference to FIG. 2 and 4. Generally the interpolation filter will smooth or average the input words, one non zero word followed by R-1 zero words for each of N signals, and provide at 816 output words at a $Nf_s$ or here $3f_s$ rate that are non-zero and generally represent interpolated results between the two input non zero words for each of N signals. These words are coupled to the delta sigma modulator 817 and converted to a bit stream of one-bit words at a $Nf_s$ or here $3f_s$ rate. Here a known modulator (not depicted) having a transfer function D(z) is replaced with a novel sigma delta modulator advantageously having a transfer function $D(z^N)$ or here $D(z^3)$. The control function 819 maintains proper synchronization between the input and output multiplexers and may also be used as required to synchronize functions such as the up sampler, etc.

Figure 9:
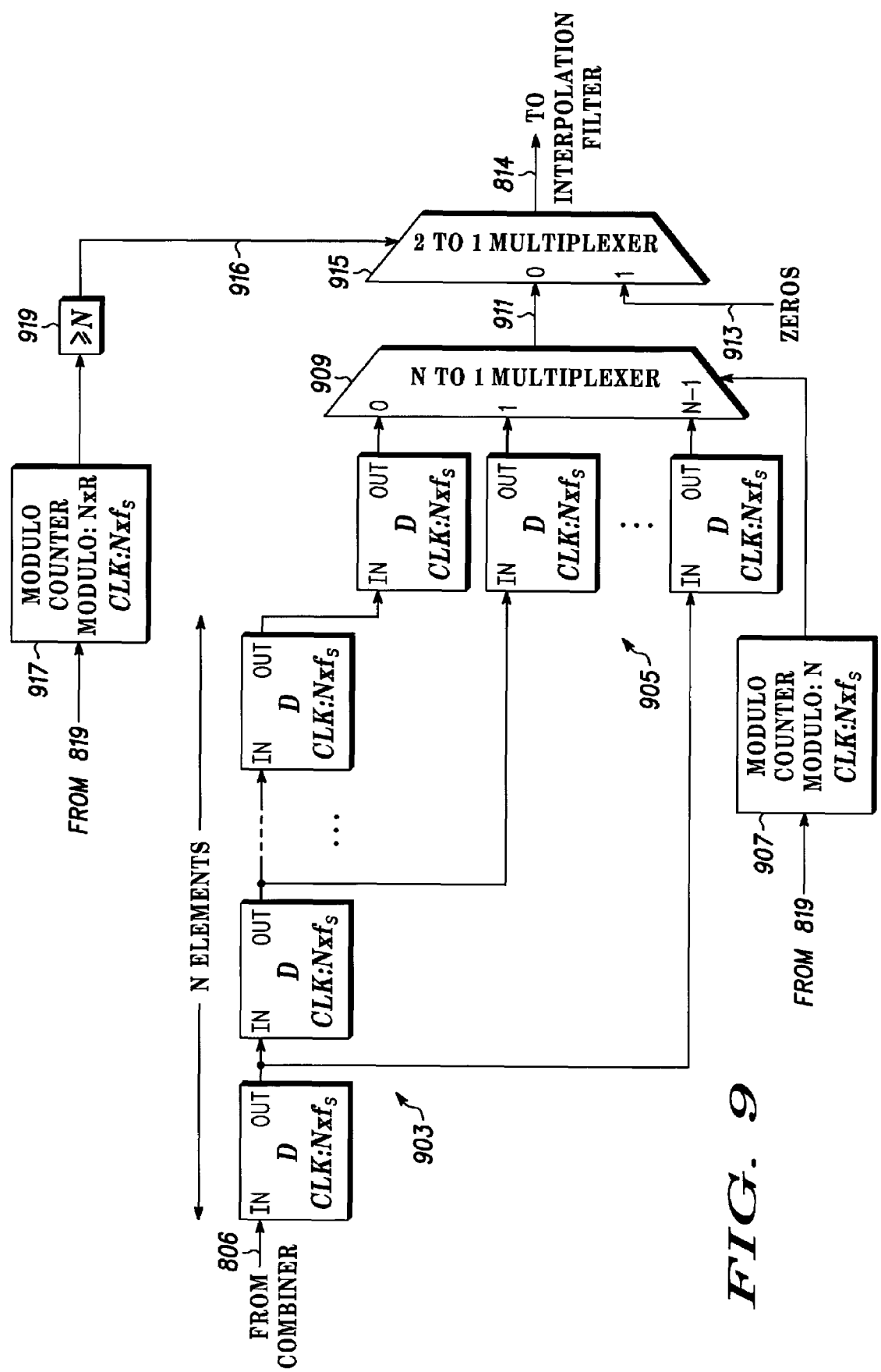
FIG. 9 depicts a block diagram of an up sampler suitable for use in the FIG. 8 apparatus according to the present invention.

Referring to FIG. 9, a block diagram of an up sampler suitable for use in the FIG. 8 apparatus will be discussed and described, noting that the result shown in FIG. 10 is the objective. The up sampler clocks in the sequence of selected signals or here digital words at 806 into a series coupled set of N, D registers 903, where each register is as wide as the words representing the signals at each Channel, using a clock at a rate of $Nf_o$ where here N=3. The contents of this set of D registers 903 are then clocked to the second set of D registers 905 at the next $f_o$ clock, where they are available to a first multiplexer 909. The first mutiplexer is controlled by a first modulo counter 907 with modulo=N, or here 3, operating from a clock at a rate of $Nf_s$ or $NRf_o$. This counter 907 will be synchronized with the $f_o$ clock by, preferably a signal from the controller 819 and will count 0,1,2, ..., N-1, 0,1, ... or here 0,1,2,0,1,2,0, ... and sequentially select the word at the input (0, 1, 2, ... ) corresponding to the count and make that word available at 911 and thus to the second muliplexer 915. The second multiplexer 915 will select the word at input "0" and make this available to the interpolation filter at 814 so long as the control signal 916 is "0". When the control signal 916 is "1" all zero words will be provided at 816. The control signal will be "0" until the count for a second modulo counter 917, modulo NR, clocked from the $Nf_s$=$NRf_o$ clock, is equal to or greater than N as determined by the comparator 919. Thus every Rth block of R N long set of words will be provided to the interpolation filter and otherwise all zeros will be provided thereby effecting the word stream 1006 at a rate of Nfs or here $3f_s$, as shown in FIG. 10.

Figure 11:
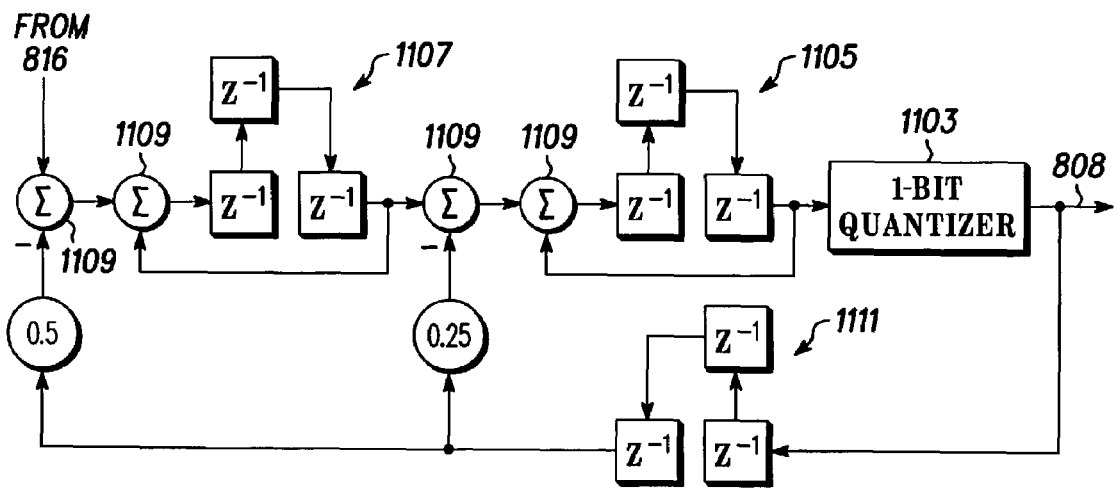
FIG. 11 depicts an exemplary block diagram of a delta sigma converter suitable for use in the FIG. 8 integrated circuit according to the present invention.

Referring to FIG. 11, an exemplary block diagram of a delta sigma converter suitable for use in the FIG. 8 integrated circuit or apparatus will be discussed and described. Similar to the above discussion of the sigma delta modulator used for an analog to digital converter the sigma delta or delta sigma modulator of FIG. 11 used to facilitate digital to analog conversion will have parameters such as coefficients, order, and the like based on various signal characteristics that are not here relevant other than to say whatever motivates the practitioner to select certain parameters and characteristics for a specific sigma delta modulator or converter still apply identically, with one exception. The inventive exception is that each delay stage in the conventional sigma delta with response D(z) must be replaced with a delay stage having series coupled elements where the number of elements corresponds to the number of the plurality of signals. Thus the sigma delta converter or modulator suitable for use in FIG. 8 will have a transfer function of $D(z^N)$ or here with 3 input signals $D(z^3)$, and each delay element in the convention modulator will be replaced with a series coupled element with N or here 3 delays.

The FIG. 11 sigma delta modulator or converter 817 has an input 816 that is coupled to the output of the interpolation filter 815 and receives digital words having a width that depends on among other matters the resolution associated with each word where these words sequentially correspond to the respective input signals or in other words correspond in an interleaved manner with the respective input signals. The depicted sigma delta converter has a 1 bit quantizer 1103 and is a second order modulator with two digital integrators 1105 and 1107. This sigma delta modulator is suitable for noise shaping or more specifically pushing noise out of the pass band of a low pass filter, high pass filter, or band pass filter. As shown the sigma delta modulator is a low pass modulator that will shift noise out of the pass band into higher frequency spectra. The summers 1109 are digital summers with a width equivalent to the word width plus at least 1 bit. Focusing on the integrator 1105, by observation a summer is followed by three (generally N) series coupled delay stages. Each of these stages as well as the analogous delay stages of integrator 1107 are as wide as the digital words plus at least one bit and are suitable for implementation as a flip-flop or plurality of parallel flip-flops or alternatively a plurality of parallel three stage shift registers, with one register for each bit in the word. Again by observation when the output at 808 is determined by the last delay stage contents this same last delay stage contents is fed back to the summer as a delayed linear combination of the last result from the summer corresponding to advantageously to the same one of the plurality of signals that is now being input as processed to the summer. Similarly analysis will be evident to one of ordinary skill for the other integrator as well as the feedback delay stage 1111. In this manner the plurality of signals is processed without one effecting another and thus shared processing is effected without causing or inducing interference or crosstalk between the plurality of signals.

Figure 12:
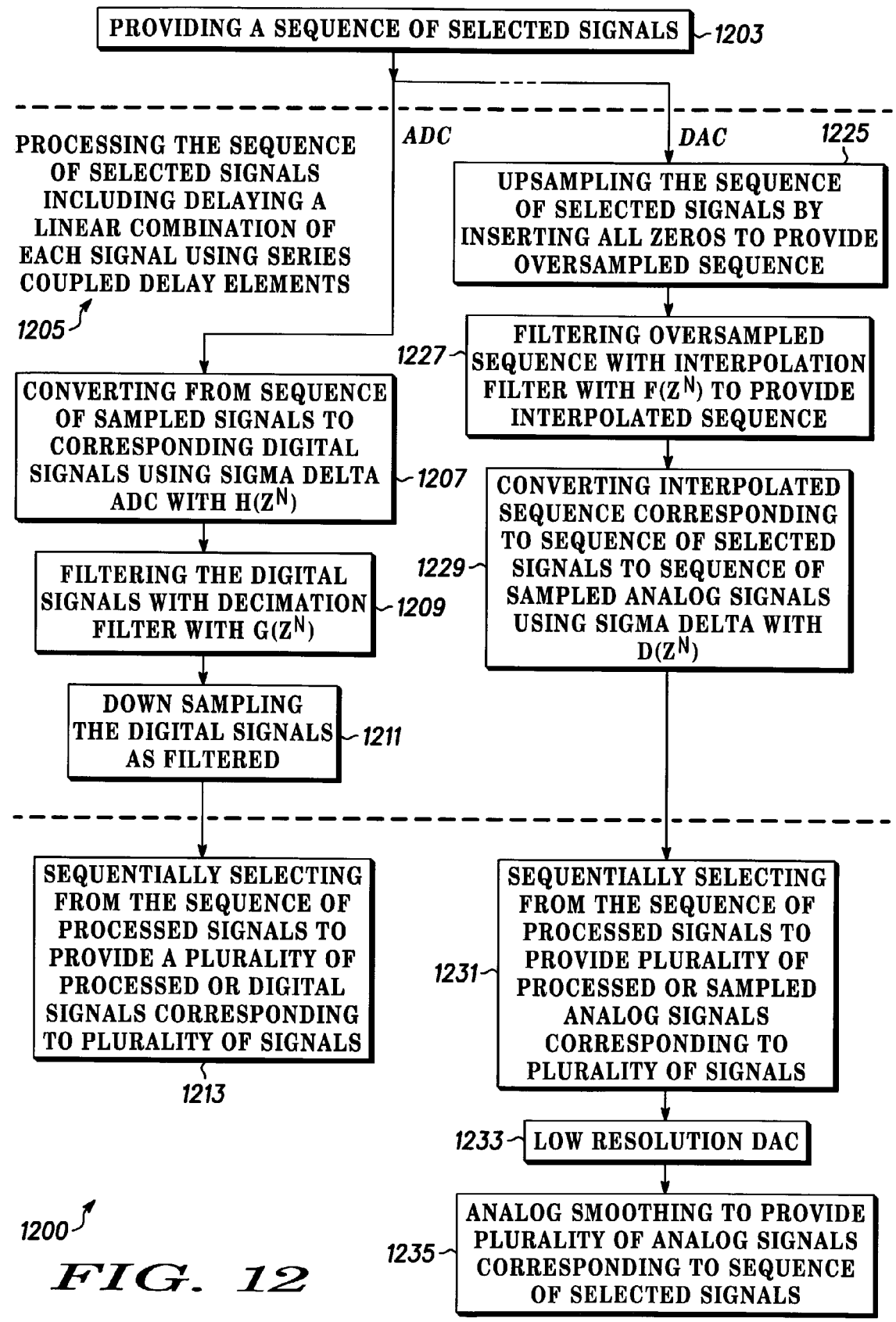
FIG. 12 shows a flow chart of a preferred method embodiment of shared processing according to the invention.

FIG. 12 shows a flow chart of a preferred method embodiment of shared processing that will now be discussed and described. The method 1200 is for processing a plurality of signals without interference or without causing or inducing interference between the signals using a shared processor. The method includes providing a sequence of selected signals 1203 corresponding to the plurality of signals, the providing further, preferably, including, for example, selecting from one of 1) two unique multiple access signals, 2) a complex signal having in phase and quadrature components, 3) spatial diversity signals, or 4) temporal diversity signals. At 1205 the method shows processing the sequence of selected signals to provide a sequence of processed signals where the processing includes delaying a linear combination of each of the sequence of selected signals using a delay stage including a plurality of series coupled delay elements, such as flip-flops or a shift register or a switched capacitor element for analog or continuously variable discrete time signals, with a delay element corresponding to each of the plurality of signals. The process at 1205 is further exemplified by and includes, alternatively, the ADC series 1207–1211 and the digital to analog (DAC) series 1225–1229.

At 1207 converting the sequence of selected signals from a sequence of sampled signals to a sequence of corresponding digital signals that are then the sequence of processed signals using a sigma delta analog to digital converter, preferably, with a transfer function of $H(z^N)$ where N is the number of selected signals, is shown. This sigma delta converter preferably includes noise shaping and may have a band pass, low pass, or even high pass filtering response. Next 1209 depicts filtering the sequence of corresponding digital signals, using a decimation filter having a filter delay stage including a plurality of series coupled filter delay elements with a transfer curve of $G(z^N)$ where the delay elements include at least one filter delay element corresponding to each of the plurality of signals or number of signals. The decimation filter and operation thereof is to limit frequency components of the sequence of corresponding digital signals before or prior to down-sampling the sequence of corresponding digital signals 1211 by selecting a portion of the sequence of corresponding digital signals to be said sequence of processed signals, the portion being a fraction of the sequence of corresponding digital signals and including an equal representation from each of the corresponding digital signals. Then 1213 depicts sequentially selecting from the sequence of processed signals to provide a plurality of processed or digital signals corresponding one to one with the plurality of signals.

Referring to the DAC series at 1225, up sampling the sequence of selected signals is shown where all zeros are inserted into a digital word stream after each sequence of selected signals representative of each of the plurality of signals a sufficient number of time to achieve the desired over sampling rate, for example 31 times for each of the plurality of signals to achieve an over sampling rate of 32, thus providing an over sampled sequence. Then, 1227 shows filtering the over sampled sequence with an interpolation filter with a transfer function of the form $F(z^N)$ to provide an interpolated sequence. This amounts to replacing each delay element in a conventional interpolation filter with N series coupled delay elements where N is the number of the plurality of signals. Next 1229 depicts converting the interpolated sequence corresponding to the sequence of selected signals to a sequence of sampled analog signals using a sigma delta converter or modulator with transfer function $D(z^N)$ where this transfer function is formed as above by replacing each delay stage in a conventional converter with N series coupled stages. Thereafter 1231 shows sequentially selecting from the sequence of processed or sampled analog signals to provide a plurality of processed signals corresponding one to one with the plurality of signals. This plurality of processed signals is then converted using low resolution, preferably, two state DACs, at 1233 and then analog smoothing is performed at 1235, for example, using an analog filter with cutoff frequency equal to the bandwidth of the analog signal, to provide a plurality of analog signals corresponding to the original plurality of signals.

The apparatus and methods discussed and described above, and the inventive principles and concepts thereof are intended to and may alleviate problems caused by prior art shared processing systems. Using the above disclosed concepts and principles of substituting a series coupled delay element for each delay element in a conventional processing function may provide an elegant solution for realizing shared processing apparatus and methodologies without causing or inducing any cross talk or interference between signals as a result of the shared processing and thus advantageously may facilitate simpler processing resource requirements and therefore smaller integrated circuit devices.

This disclosure is intended to explain how to fashion and use various embodiments in accordance with the invention rather than to limit the true, intended, and fair scope and spirit thereof. The foregoing description is not intended to be exhaustive or to limit the invention to the precise forms disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A signal processing apparatus that is arranged and constructed to be shared for processing a plurality of signals without interference between the signals, the signal processing apparatus comprising:

an input multiplexer for sequentially selecting from among the plurality of signals to provide a sequence of selected signals at a first sample rate;

a processing unit for concurrently processing the sequence of selected signals to provide a sequence of processed signals at a second sample rate that differs from the first sample rate, the processing unit having an input coupled to the input multiplexer and a delay stage including a number of series coupled delay elements with the number of delay elements corresponding to the plurality of signals;

an output de-multiplexer for sequentially selecting from the sequence of processed signals at the second sample rate to provide a plurality of processed signals corresponding one to one with the plurality of signals; and a controller for synchronizing the input multiplexer, the processing unit, and the output de-multiplexer so that the plurality of processed signals correspond one to one with the plurality of signals.

2. The signal processing apparatus of claim 1 wherein said processing unit further includes a sigma delta analog to digital converter (ADC), including the delay stage, for converting the sequence of selected signals from a sequence of sampled signals to a sequence of corresponding digital signals that are said sequence of processed signals.

3. The signal processing apparatus of claim 2 further including a down-sampler that selects a portion of the sequence of corresponding digital signals to be said sequence of processed signals, the portion being a fraction of the sequence of corresponding digital signals and including an equal representation from each of the corresponding digital signals.

4. The signal processing apparatus of claim 3 further including a decimation filter having an input coupled to the sequence of corresponding digital signals, an output coupled to the down-sampler, and a filter delay stage including a plurality of series coupled filter delay elements with a filter delay element corresponding to each of the plurality of signals, the decimation filter for filtering the sequence of corresponding digital signals to limit frequency components of the sequence of corresponding digital signals before selecting the portion of the sequence of corresponding digital signals.

5. The signal processing apparatus of claim 1 wherein said processing unit further includes a sigma delta based modulator having the delay stage and noise shaping properties for converting the sequence of selected signals from a sequence of sampled signals to a sequence of corresponding digital signals that have been filtered.

6. The signal processing apparatus of claim 5 wherein said sigma delta based modulator is for converting the sequence of selected signals from a sequence of sampled signals to a sequence of corresponding digital signals that have been one of low pass, high pass, and band pass filtered.

7. The signal processing apparatus of claim 1 wherein said input multiplexer sequentially selects from the plurality of signals corresponding to one of two unique multiple access signals, a complex signal having in phase and quadrature components, spatial diversity signals, and temporal diversity signals.

8. The signal processing apparatus of claim 1 wherein the delay stage is one of a plurality of series coupled flip-flops, a shift register, and a plurality of series coupled switched capacitor delays.

9. A method of processing a plurality of signals without interference between the signals using a shared processor, the method comprising:

providing, at a first sample rate, a sequence of selected signals corresponding to the plurality of signals;

process, concurrently, the sequence of selected signals to provide a sequence of processed signals at a second sample rate that differs from the first sample rate, the processing including delaying a linear combination of each of the sequence of selected signals using a delay stage including a plurality of series coupled delay elements with a delay element corresponding to each of the plurality of signals; and sequentially and synchronously with the providing the sequence of processed signals at the second sample rate, selecting from the sequence of processed signals to provide a plurality of processed signals corresponding one to one with the plurality of signals.

10. The method of claim 9 wherein said processing the sequence of selected signals further includes
converting the sequence of selected signals from a sequence of sampled signals to a sequence of corresponding digital signals that are said sequence of processed signals using a sigma delta analog to digital converter.

11. The method of claim 10 further including down-sampling the sequence of corresponding digital signals by selecting a portion of the sequence of corresponding digital signals to be said sequence of processed signals, the portion being a fraction of the sequence of corresponding digital signals and including an equal representation from each of the corresponding digital signals.

12. The method of claim 11 further including filtering the sequence of corresponding digital signals, using a decimation filter having a filter delay stage including a plurality of series coupled filter delay elements with one filter delay element corresponding to each of the plurality of signals, to limit frequency components of the sequence of corresponding digital signals before selecting the portion of the sequence of corresponding digital signals.

13. The method of claim 9 wherein said processing the sequence of selected signals further includes converting the sequence of selected signals from a sequence of sampled signals to a sequence of corresponding digital signals and filtering the sequence of corresponding digital signals using a sigma delta based modulator with noise shaping properties.

14. The method of claim 9 wherein said filtering the sequence of corresponding digital signals further includes one of low pass, high pass, or band pass filtering the sequence of corresponding digital signals.

15. The method of claim 9 wherein said providing a sequence of selected signals further includes selecting from one of two unique multiple access signals, a complex signal having in phase and quadrature components, spatial diversity signals, and temporal diversity signals.

16. The method of claim 9 wherein said delaying a linear combination of each of the sequence of selected signals using a delay stage further includes using one of a plurality of series coupled flip-flops, a shift register, and a plurality of series coupled switched capacitor delays.

17. An integrated circuit that is arranged and constructed to perform shared processing for a plurality of signals without interference between the signals, the integrated circuit comprising:
an input multiplexer for sequentially selecting from among the plurality of signals to provide a sequence of selected signals at a first sample rate;
a processing unit for concurrently processing the sequence of selected signals to provide a sequence of processed signals at a second sample rate that differs from the first sample rate, the processing unit having an input coupled to the input multiplexer and a delay stage including a number of series coupled delay elements with the number of delay element corresponding to the plurality of signals;
an output de-multiplexer for sequentially selecting from the sequence of processed signals at the second sample rate to provide a plurality of processed signals corresponding one to one with the plurality of signals; and
a controller for synchronizing the input multiplexer, the processing unit, and the output de-multiplexer so that the plurality of processed signals correspond one to one with the plurality of signals.

18. The integrated circuit of claim 17 wherein said processing unit further includes a sigma delta analog to digital converter (ADC) for converting the sequence of selected signals to a sequence of corresponding digital signals that are said sequence of processed signals.

19. The integrated circuit of claim 17 wherein said processing unit further includes a sigma delta digital to analog converter (DAC), an up sampler, and an interpolation filter for converting the sequence of selected signals into the plurality of processed signals corresponding to a sampled analog version of the plurality of signals.

20. The integrated circuit of claim 18 further including a down-sampler that selects a portion of the sequence of corresponding digital signals to be said sequence of processed signals, the portion being a fraction of the sequence of corresponding digital signals and including an equal representation from each of the corresponding digital signals.

21. The integrated circuit of claim 20 further including a decimation filter having an input coupled to the sequence of corresponding digital signals, an output coupled to the down-sampler, and a filter delay stage including a plurality of series coupled filter delay elements with one filter delay element corresponding to each of the plurality of signals, the decimation filter for filtering the sequence of corresponding digital signals to limit frequency components of the sequence of corresponding digital signals before selecting the portion of the sequence of corresponding digital signals.

22. The integrated circuit of claim 17 wherein said processing unit further includes a filter for converting the sequence of selected signals from a sequence of sampled signals to a sequence of corresponding digital signals that have been filtered.

23. The integrated circuit of claim 22 wherein said filter further includes a sigma delta modulator having the delay stage and noise shaping properties having one of a low pass, band pass, and high pass response.

24. The integrated circuit of claim 17 wherein said input multiplexer sequentially selects from the plurality of signals corresponding to one of two unique multiple access signals, a complex signal having in phase and quadrature components, spatial diversity signals, and temporal diversity signals.

25. The integrated circuit of claim 17 wherein the delay stage is one of a plurality of series coupled flip-flops and a shift register and a plurality of series coupled switched capacitor delays.

26. The integrated circuit of claim 17 wherein the processing unit is one of a sigma delta digital to analog converter and an interpolation filter.

27. The integrated circuit of claim 17 the delay stage includes N series coupled delay elements when the plurality of signals is N signals.

* * * * *

UNITED STATES PATENT AND TRADEMARK OFFICE
CERTIFICATE OF CORRECTION

| | | |
|---|---|---|
| PATENT NO. | : 7,142,606 B2 | Page 1 of 1 |
| APPLICATION NO. | : 10/256906 | |
| DATED | : November 28, 2006 | |
| INVENTOR(S) | : Talwalkar et al. | |

It is certified that error appears in the above-identified patent and that said Letters Patent is hereby corrected as shown below:

Column 12 line 59 delete "process" and insert --processing--

Signed and Sealed this

Sixth Day of February, 2007

JON W. DUDAS
*Director of the United States Patent and Trademark Office*